United States Patent [19]
Levasseur et al.

[11] 3,938,061
[45] Feb. 10, 1976

[54] FREQUENCY SUMMING DEVICE

[75] Inventors: Georges Levasseur, Goussainville;
Michel Garconnat, Ris Orangis, both of France

[73] Assignee: Compagnie Industrielle des Telecommunications Cit-Alcatel, France

[22] Filed: Dec. 20, 1973

[21] Appl. No.: 426,576

[30] Foreign Application Priority Data
Dec. 20, 1972 France .................. 72.45392

[52] U.S. Cl. .............. 332/45; 325/137; 333/29
[51] Int. Cl.² ...................................... H03C 1/52
[58] Field of Search .............. 332/44, 45; 325/137–139, 50; 333/29

[56] References Cited
UNITED STATES PATENTS
3,243,731  3/1966  Erickson ................... 332/45 X
3,319,189  5/1967  Silverman ..................... 332/45

*Primary Examiner*—Alfred L. Brody
*Attorney, Agent, or Firm*—Craig & Antonelli

[57] ABSTRACT

Frequency summing device comprising a summing element effecting the summing of the output signals of a first multiplier receiving a signal whose frequency is f and a signal whose frequency is F and of a second multiplier receiving the signal whose frequency is $f$ and the signal whose frequency is F after dephasing by 90°. The dephasing by 90° is obtained by a complex circuit comprising three elementary dephasers in series provided with an attenuator and an adder effecting the sum of the output signals of the attenuator and of the first dephaser.

10 Claims, 6 Drawing Figures

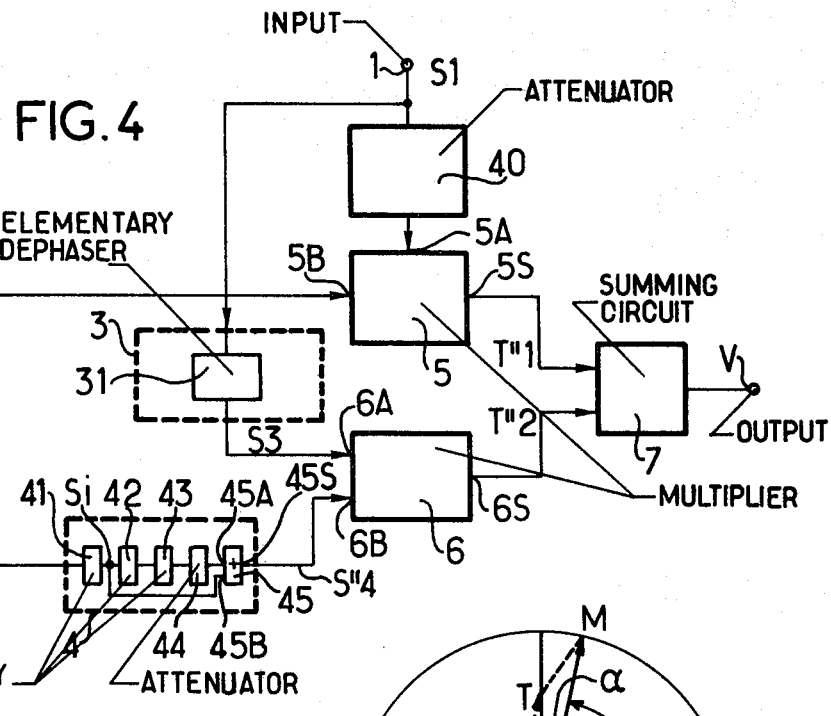
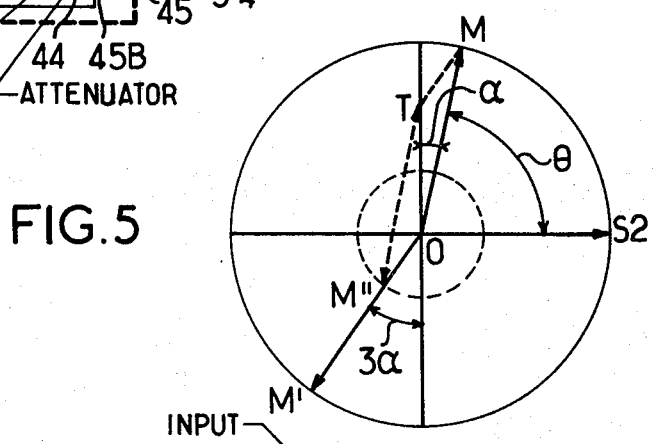
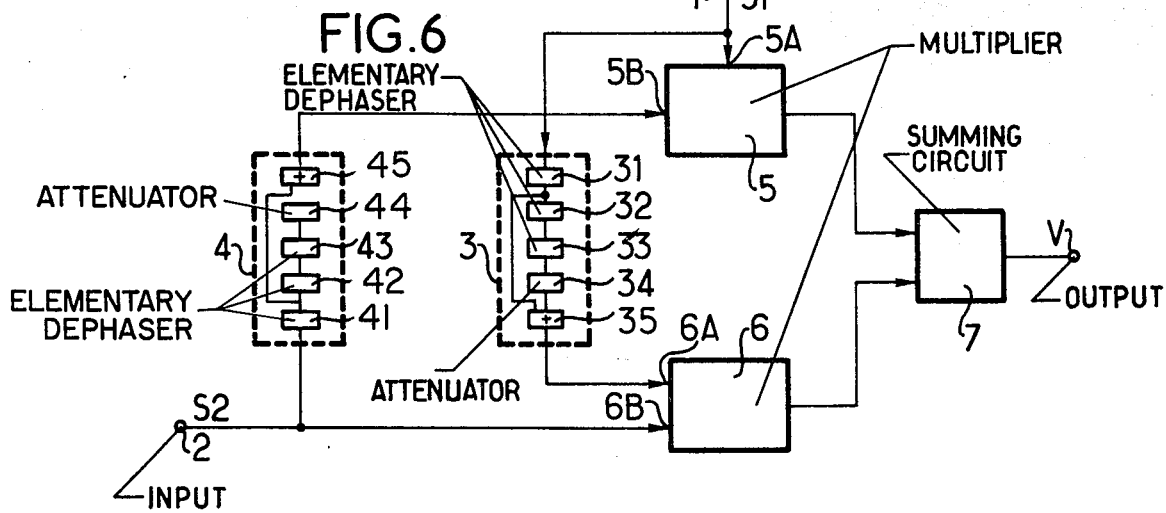

3,938,061

FREQUENCY SUMMING DEVICE

The present invention relates to a frequency summing device.

It is known that frequency transposition devices fed by a signal whose frequency is F and a signal whose frequency is f provide two signals, the one having a frequency of $F + f$ and the other having a frequency of $F - f$ as well as a mixture of harmonics of the input signals. It is known, on the other hand that to effect the summing of the two frequencies F and f and to obtain one of the two frequencies $F + f$ or $F - f$, it is necessary to have available a filter eliminating all the output signals of the transposition device whose frequencies differ from $F + f$ or from $F - f$.

When the frequency f is low in relation to the frequency F, the two frequencies $F + f$ and $F - f$ are close to each other and it is necessary, in order to retain only one of these two frequencies, to eliminate the other by means of a filter whose characteristic is very stiff.

The construction of such a filter is expensive and delicate and the device according to the invention makes it possible to avoid the use of such a filter.

For that purpose, the summing device for summing two frequencies F and f fed by a first signal whose frequency is F and a second signal whose frequency is f is characterized in that it comprises a first dephasing circuit receiving the said first signal and supplying a third signal whose frequency is F dephased by 90° in relation to the said first signal, a second dephasing circuit receiving the said second signal and supplying a fourth signal whose frequency is f dephased by 90° in relation to the said second signal, a first and a second analog multiplier each comprising two inputs and an output, the said first multiplier receiving on its inputs a signal whose frequency is F and a signal whose frequency is f taken in the group of signals constituted by the said first, second, third and fourth signals, the said second multiplier receiving at its inputs the two remaining signals of that group, a summing device effecting the summing of the output voltages of the two multipliers.

The first signal is in the form of $S1 = A \sin 2\pi Ft$ and the second signal is in the form of $S2 = B \sin (2\pi ft + q)$ q being the angle of dephasing at the instant $t = 0$ between the two signals A and B being their respective amplitudes.

At the output of the multipliers, the two signals AB sine $(2\pi ft + q)$ and AB cosine $2\pi Ft$ cosine $(2\pi ft + q)$ which, by addition, give the signal AB cosine $[2\pi (F-f)t - q]$ and, by subtraction, give AB cosine $[2\pi (F-f)t + q]$ for example, are obtained.

Therefore, either the difference or the sum of the two frequencies are obtained, but not both simultaneously.

The invention is interesting more particularly when the f varies in a frequency band centered on a frequency fo. According to an improvement of the invention, the summing device is characterized in that the said second dephasing circuit comprises a first elementary dephaser provided with an input and an output receiving on the said second signal whose frequency is f and providing an intermediate signal whose amplitude is equal to the amplitude of the said second signal and whose dephasing in relation to the said second signal depends on the frequency f, that dephasing being equal to 90° for the frequency fo, a second and a third elementary dephaser connected up in series at the output of the said first elementary dephaser, an attenuator having an attenuation factor of 3 whose input is connected up to the output of the said third elementary dephaser, an adder whose two inputs are connected together at the outputs of the said first elementary dephaser and of the said attenuator and whose output supplies the said fourth signal.

The said dephasing circuit supplies a signal having a relatively constant amplitude dephased substantially by 90° in relation to the input signal.

In the case where the frequency F is fixed, the first dephasing circuit according to the invention comprises means for attenuating one of the signals applied to the analog multiplier which does not receive the said fourth signal.

That attenuator is used to compensate the attenuation of the signal whose frequency is f due to the second dephasing circuit.

When the frequency F varies in a frequency band centered on the frequency Fo, the said first dephasing circuit is characterized in that it comprises a first elementary dephaser provided with an input and an output receiving on the said input the said first signal whose frequency is F and providing an intermediate signal whose amplitude is equal to the amplitude of the said first signal and whose dephasing in relation to the said first signal depends on the frequency F, that dephasing being equal to 90° for the frequency Fo, a second and a third elementary dephaser connected up in series to the output of the said first elementary dephaser, an attenuator having an attenuation factor of 3, whose input is connected up to the output of the said third elementary dephaser, an adder whose two inputs are connected together at the outputs of the said first elementary dephaser and of the said attenuator and whose output provides the said third signal.

The devices according to the invention therefore make it possible to carry out the sum or the difference of two frequencies F and f, whether they be fixed or vary in fairly narrow bands which extend up to about ± 20 percent about the central frequencies (Fo and fo).

The device according to the invention may be applied to single side band modulators in which it is necessary to obtain a signal whose frequency is $F + f$ or $F - f$, F being the carrier frequency and f being the data and being variable. The device according to the invention avoids the use of a filter whose characteristic is very stiff, intended for canceling one of the two modulation bands so as to keep only the other.

The following description given with reference to the accompanying drawings will make it easier to understand how the invention may be implemented.

FIG. 4 shows the block diagram of the summing device for a fixed frequency and a variable frequency according to the invention;

FIG. 5 shows, in a vectorial form, the electrical signals at different points of the variable frequency dephasing circuit shown in FIG. 4; and FIG. 6 shows the block diagram of the summing device for two variable frequencies, according to the invention.

Figure 1:
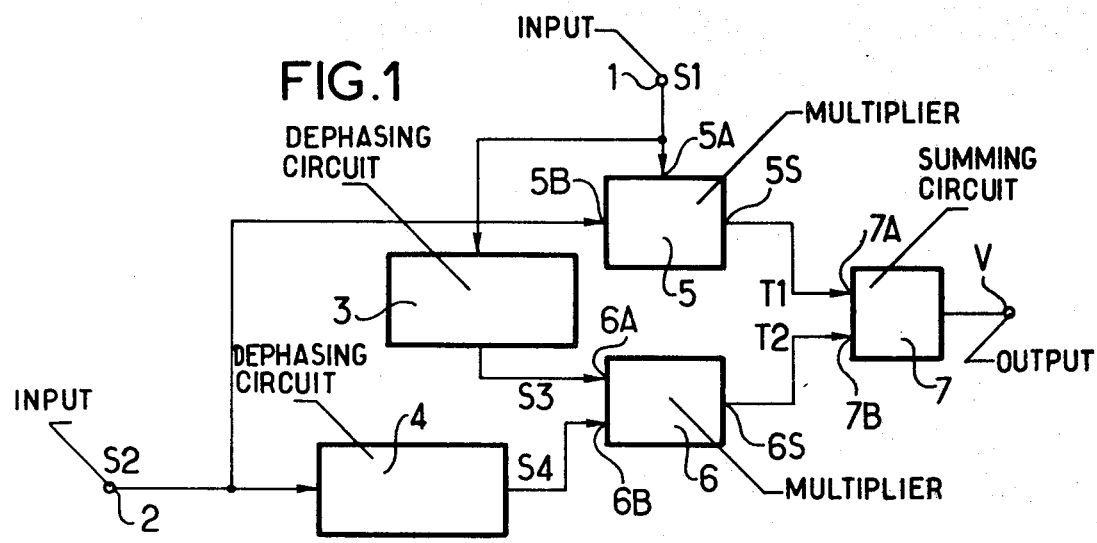
FIG. 1 shows a block diagram of the summing device according to the invention.

FIG. 1 shows a block diagram of the summing device according to the invention. That device comprises two input terminals 1 and 2 on which are applied a signal whose form is S1 = A sine 2 $\pi$ Ft. A representing the amplitude, F representing the frequency and t representing the time; and S2 = B sine (2 $\pi$ ft + q), q being the dephasing at the origin of the signal S2 in relation to the signal S1, B being the amplitude and $f$ being the frequency.

The device comprises also two dephasing circuits, 3, 4, two analog multipliers 5, 6 and a summing circuit 7. Each analog multiplier 5, 6, comprises two inputs 5A and 5B and an output 5S, respectively 6A and 6B and an output 6S.

The signal S1 is applied to the dephasing circuit 3 providing a signal S3 dephased by 90° in relation to S1. S3 = A cosine 2 $\pi$ Ft.

The signal S2 is applied to the dephasing circuit 4 which supplied a signal S4 dephased by 90° in relation to S2. S4 = B cosine (2 $\pi$ ft + q).

The signals S1 and S2 are applied to the two inputs 5A and 5B of the multiplier 5 and the signals S3 and S4 are applied to the two inputs 6A and 6B of the multiplier 6.

A signal T1 is obtained on the output 5S where:
T1 = AB sine (2 $\pi$ Ft) sine (2 $\pi$ ft + q)
and on the output 6S, a signal T2 is obtained:
T2 = AB cosine (2 $\pi$ Ft) cosine (2 $\pi$ ft + q).

The two outputs 5S and 6S are connected together at the two inputs 7A and 7B of the summing circuit 7.

When it is required to obtain the difference between the two frequencies, it is sufficient to connect up the summing circuit 7 as an adder and when it is required to obtain the sum of the two frequencies, the summing circuit 7 is connected up as a subtractor. By subtracting the signal T2 from T1, the signal obtained is:
V = T1 − T2 = AB cosine 2[(F + f)t + q]
and on adding the signals T1 and T2, the signal obtained is:
V = T1 + T2 = AB cosine [2 $\pi$ (F − f)t + q]

Figure 2:
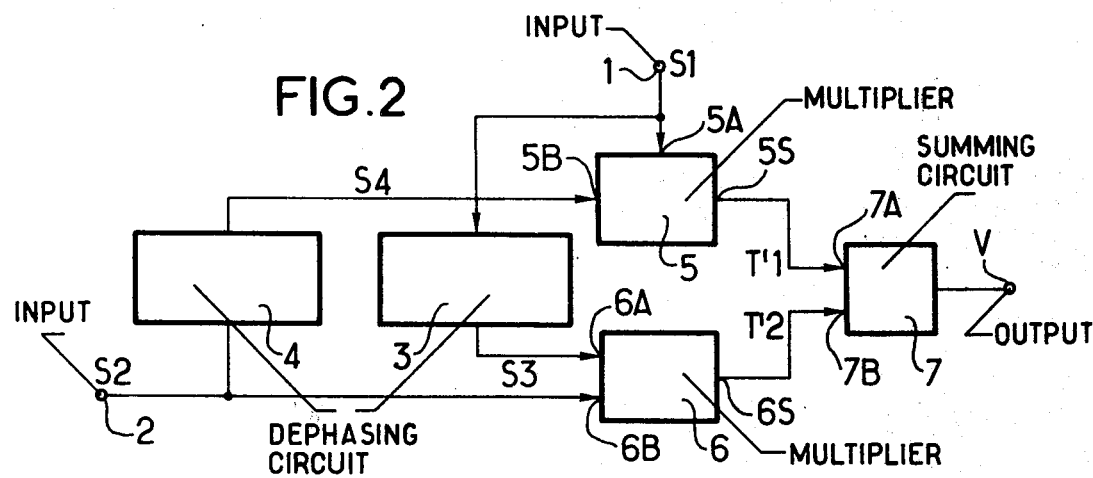
FIG. 2 shows a variant of the summing device according to the invention.

FIG. 2 shows a variant of the device in FIG. 1 in which the signals applied to the inputs 5B and 6B have been interchanged. The signal S2 is applied to the input 6B of the multiplier 6 and the signal S4 is applied to the input 5B of the multiplier 5. Therefore, the following is obtained at the output of the multiplier 5:

The signal T'1 = AB sine (2 $\pi$ Ft) cosine [2 $\pi$ ft + q] and the following is obtained at the output of the multiplier 6:

The signal T'2 = AB cosine (2 $\pi$ ft) sine [2 $\pi$ ft + q]. On carrying out the sum of these two signals T'1 and T'2, a signal whose frequency is F + $f$ is obtained and on subtracting them, a signal having a frequency of F − $f$ is obtained.

Figure 3:
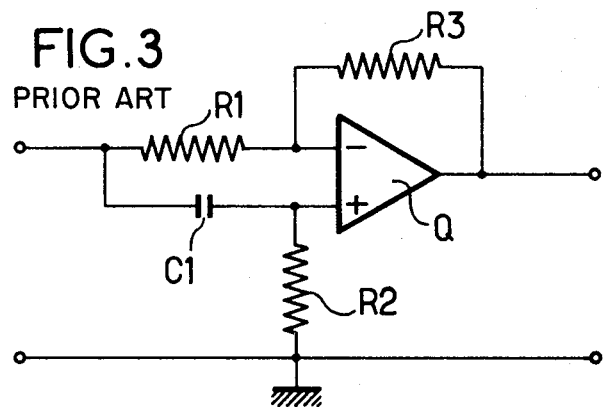
FIG. 3 shows an elementary dephaser of a known type.

FIG. 3 shows the diagram of a known elementary dephaser. That dephaser enables a signal having a constant amplitude but whose dephasing varies with the frequency of the input signal to be obtained.

The dephaser comprises an operational amplifier Q having a very high gain in the open band and comprising a first and a second input and an output.

The input signal is applied to the first input through a resistor R1 and on a second input through a capacitor C1. That second input is earthed through a resistor R2.

A resistor R2 is connected up between the first input and the output. Assuming that R1 = 2R2, the transfer function of that elementary dephaser is
H (j$\omega$) = (R2 C1 j$\omega$ − 1) / (R2 C1 j$\omega$ + 1)

$\omega$ being the pulsation of the input signal where $\omega$ = 2 $\pi$ F, F being the frequency of the input signal and j being the square root of − 1.

The output signal has an amplitude equal to that of the input signal and it is dephased by an angle of $\theta$ where
$\theta$ = 2 arc tg (1/(R2 C1 $\omega$))

That dephasing is equal to 90° when the frequency assumes a value Fo satisfying the expression 2 R2 C1 Fo = 1.

When the frequencies f and F are fixed, it is possible to use, as dephasing circuits in the device shown in FIG. 1, dephasers of the known type such as shown in FIG. 2.

The dephaser 3 dephases by 90° at the frequency F and the dephaser 4 dephases by 90° at the frequency $f$.

The analog multipliers will, to great advantage, be of the type such as described in the first addition to French Pat. No. 1,517,023.

FIG. 4 shows the block diagram of a device for summing a fixed frequency F and a variable frequency $f$. The frequency $f$ varies on either side of a central frequency fo. That device is similar to that in FIG. 1 and the like elements have been referenced identically and comprise two input terminals 1 and 2, two dephasing circuits 3 and 4, two analog multipliers 5 and 6 and a summing device 7.

The dephasing circuit 3 comprises an elementary dephaser 31 dephasing by 90° at the frequency F, of the type shown in FIG. 3. The dephasing circuit 4 comprises three identical elementary dephasers 41, 42, 43, of the type shown in FIG. 2 and dephasing by 90° at the frequency fo.

The three dephasers 41, 42, 43 are connected up in series and to the output of the last dephaser 43 is connected an attenuator 44 whose output is connected up to the first input 45A of an adder 45 whose second input 45B is connected up to the output of the first dephaser 41.

A signal having a relatively constant amplitude and a dephasing substantially equal to 90° in relation to the input signal is obtained at the output 45S of the adder 45.

The attenuator 44 attenuates with a factor 3 and a signal S'4 dephased by 90° in relation to S2 and whose amplitude is B/a, a being a coefficient greater than 1, is obtained at the output of the dephasing circuit 3.

Therefore, a signal T"2 having the form T"2 = S3.S4/a is obtained at the output of the multiplier 6.

It is assumed that AB/a cosine (2 $\pi$ FT). cosine (2 $\pi$ ft + q).

An attenuator 40 having attenuation coefficient of a is arranged in front of the input 5A so that the signal T"1 obtained at the output 5S has the form
T"1 = S1.S2/a
that is AB/a sine (2 $\pi$ Ft) sine (2 $\pi$ ft = q) T"1 therefore has an amplitude equal to T"2.

The summing element 7 carries out the summing of the two signals T"1 and T"2 and therefore supplies a signal whose frequency is equal either to the sum or to the difference of the two frequencies f and F.

It will be observed that the attenuator 40 may also be arranged at the input 5B of the multiplier 5.

The operation of the dephasing circuit 4 will be better understood on referring to FIG. 5 showing an explanatory diagram in which the electric signals have been illustrated by their Fresnel vectors.

It is assumed that OS2 is the horizontal vector representing the input signal whose frequency is $f$.

At the output of the dephaser 41, an intermediate signal Si represented by the vector OM having the same module as OS2 but dephased by an angle $\theta = \pi/2 - \alpha$ is obtained at the output of the dephaser 41.

When the frequency $f$ is equal to fo, $\theta = \pi/2$.

A signal which may be represented by a vector OM' dephased by $3\theta$, that is, $3\pi/2 - 3\alpha$ in relation to OS2 but having the same module is obtained at the output of the dephaser 43.

The signal represented by OM' is applied to the attenuator 44 which attenuates that signal by a factor K so that a signal represented by the vector $OM'' = OM'/k$ is obtained at the output.

In the adder 8, the sum of the two vectors OM and OM'' is carried out and a signal represented by the vector OT dephased by an angle $\beta$ in relation to OS2 is obtained.

Assuming that OS2 = 1, the result obtained $OT^2 = 1 + 1/k^2 - (2/k) \cosine 2\alpha$, and $$tg\left(\frac{\pi}{2} - \beta_{3\alpha}\right) = (\sin\alpha - (1/k)\sine\, 3\alpha)/(\cosine\,\alpha \pm (1/k)\cosine\, 3\alpha)$$

The ± sign depends on the quadrant in which OM is situated. In the first quadrant, the sign is −.

Assuming $k = 3$ and making $f$ vary only by fo/5 on either side of fo, the result obtained is, approximately:
$OT^2 = 4/9$, that is, $OT = \frac{2}{3}$
and tg $(\pi/2 - \beta) = 0$, that is, $\beta = \pi/2$ Therefore, the attenuation coefficient a of the attenuator 40 must be chosen equal to 3/2.

The summing device shown in FIG. 4 may be used as a signle sideband modulator, F being the carrier frequency and f being the frequency of the data.

FIG. 6 shows the summing device for summing two variable frequencies F and f, according to the invention.

The frequency F varies on either side of the central frequency Fo and the frequency f varies on either of the central frequency fo.

The frequency summing device is similar to that shown in FIG. 2 and its two dephasing circuits are formed like the dephasing circuit 4 for the signal S2 of the device shown in FIG. 4.

The dephasing circuit 4 therefore comprises 3 elementary dephasers 41, 42, 43 of the type described in FIG. 2, an attenuator 44 and an adder 45 and the dephasing circuit 3 also comprises three elementary dephasers 31, 32, 33 of the type described in FIG. 2, an attenuator 34 and an adder 35.

The elementary dephasers 41, 42 and 43 dephase by 90° at the frequency fo and the elementary dephasers 31, 32, 33 dephase by 90° at the frequency Fo.

The attenuations of the dephasing circuits 3 and 4 are compensated and it is no longer necessary to provide extra attenuation means as in the device in FIG. 4.

It would also be possible to use the device in FIG. 1 for carrying out the sum of two variable frequencies, but it would then be necessary to provide an attenuator to compensate the attenuations of the two dephasing circuits 3 and 4, which would be added together.

To obtain a good result, f must vary only by fo/5 on either side of fo and F must vary only by Fo/5 on either side of Fo.

The dephasing circuits 3 and 4 used for dephasing the frequency signals in the embodiments in FIGS. 4 and 6 may be replaced by other circuits.

Although the frequency summing devices which have just been described appear to afford the greatest advantage for implementing the invention, it will be understood that various modifications may be made thereto without going beyond the scope of the invention, it being possible to replace certain of their elements by other elements capable of fulfilling the same technical function or an equivalent technical function therein.

What is claimed is:

1. Device for summing two first and second sinusoidal signals of frequency F and $f$, respectively, comprising a first dephasing circuit receiving said first signal and providing a third signal whose frequency is F dephased 90° in relation to the said first signal, a second dephasing circuit receiving said second signal and providing a fourth signal whose frequency is $f$ dephased by 90° in relation to said second signal, a first and a second analog multiplier each comprising two inputs, said first multiplier receiving on one of its inputs a signal whose frequency is F and a signal whose frequency is f taken from the group of signals constituted by said first, second, third and fourth signals, said second multiplier receiving at its inputs, the two remaining signals of said group, and an adder having inputs connected to the outputs of said two multipliers, characterized in that the frequency f varies in a frequency band centered on the frequency fo and in that said second dephasing circuit comprises a first elementary dephaser receiving on its input said second signal whose frequency is f and providing at its output an intermediate signal whose amplitude is equal to the amplitude of said second signal and whose dephasing in relation to the said second signal depends on the frequency $f$, that dephasing being equal to 90° for the frequency $fo$, a second and a third elementary dephaser connected in series to the output of the said first elementary dephaser, an attenuator having an attenuation factor of 3 whose input is connected to the output of said third elementary dephaser, and an adder having two inputs connected to the output of the said first elementary dephaser and of said attenuator, respectively, and whose output provides said fourth signal.

2. Device according to claim 1, characterized in that the frequency F is constant, and further comprising means for attenuating one of the signals applied to the multiplier receiving said second signal.

3. Device according to claim 1, characterized in that the frequency F varies in a frequency band centered on the frequency Fo and in that the said first dephasing circuit comprises a first elementary dephaser receiving on its input said first signal whose frequency is F and providing at its output an intermediate signal whose amplitude is equal to the amplitude of the said first signal and whose dephasing in relation to the said first signal depends on the frequency F, that dephasing being equal to 90° for the frequency Fo, a second and a third elementary dephaser connected in series to the output of the said first elementary dephaser, an attenuator having an attenuation factor of 3 whose input is connected to the output of said third elementary dephaser, and an adder having two inputs connected to the outputs of said first elementary dephaser and to said attenuator, respectively, and whose output provides said third signal.

4. A device for summing a first and a second sinusoidal signal of frequency F and f, respectively, comprising a first dephasing circuit receiving said first signal and providing a third signal whose frequency is F dephased 90° in relation to said first signal; a second dephasing circuit receiving said second signal and providing a fourth signal whose frequency is $f$ dephased by 90° in relation to said second signal, said second dephasing circuit including a first elementary dephaser which receives on its input said second signal and provides at its output an intermediate signal whose amplitude is equal to the amplitude of said second signal and whose dephasing in relation to said second signal depends on the frequency $f$, a second and a third elementary dephaser connected in series to the output of said first elementary dephaser, an attenuator whose input is connected to the output of said third elementary dephaser, and an adder having two inputs respectively connected to the output of said first elementary dephaser and to the output of said attenuator and whose output provides said fourth signal; a first multiplier having first and second inputs, said first input receiving one of said first, second, third and fourth signals and said second input receiving another of said first, second, third and fourth signals; a second multiplier having first and second inputs, said first input of said second multiplier receiving another of said first, second, third and fourth signals and said second input of said second multiplier receiving the remaining one of said first, second, third and fourth signals; and an adder having inputs connected to the outputs of said first and second multipliers.

5. A device as defined in claim 4, wherein said first and second inputs of said first multiplier receive said first and second signals, respectively; and said first and second inputs of said second multiplier receive said third and fourth signals, respectively.

6. A device as defined in claim 5, wherein said frequency F is constant and said frequency f varies in a frequency band centered on the frequency fo, and the dephasing for the frequency $fo$ is equal to 90°.

7. A device as defined in claim 6, further comprising means for attenuating one of said first and second signals before it is received by said first multiplier.

8. A device as defined in claim 4, wherein said first and second inputs of said first multiplier receive said first and fourth signals, respectively; and said first and second inputs of said second multiplier receive said third and second signals, respectively.

9. A device as defined in claim 8, wherein said frequencies F and f vary in a frequency band centered on the frequencies Fo and fo, respectively, and the dephasing for the frequencies Fo and fo is equal to 90°.

10. A device as defined in claim 9, wherein said first dephasing circuit includes a first elementary dephaser which receives on its input said first signal and provides at its output an intermediate signal whose amplitude is equal to the amplitude of said first signal and whose dephasing in relation to said first signal depends on the frequency F, a second and a third elementary dephaser connected in series to the output of said first elementary dephaser included in said first dephasing circuit, an attenuator whose input is connected to the output of said third elementary dephaser included in said first dephasing circuit, and an adder having two inputs respectively connected to the output of said first elementary dephaser included in said first dephasing circuit and to the output of said attenuator included in said first dephasing circuit and whose output provides said third signal.

\* \* \* \* \*